United States Patent [19]

Marcy

[11] 3,797,935

[45] Mar. 19, 1974

[54] SYSTEMS FOR WRITING PATTERNS ON PHOTOSENSITIVE SUBSTRATES

[75] Inventor: Raymond Marcy, Paris, France

[73] Assignee: Thomson-CSF, Paris, France

[22] Filed: Apr. 25, 1972

[21] Appl. No.: 247,345

[30] Foreign Application Priority Data

May 4, 1971 France .............................. 71.16048

[52] U.S. Cl. .......................... 355/53, 95/12, 355/40, 355/54

[51] Int. Cl. ........................................... G03b 27/32

[58] Field of Search ............... 355/53, 54, 40; 95/12

[56] References Cited

UNITED STATES PATENTS

| | | | |
|---|---|---|---|
| 3,632,205 | 1/1972 | Marcy | 95/12 X |
| 3,575,588 | 4/1971 | Hermann | 355/53 X |
| 3,498,711 | 3/1970 | Ables et al. | 355/53 |
| 3,617,125 | 11/1971 | Sobottke | 355/53 X |

*Primary Examiner*—Samuel S. Matthews
*Assistant Examiner*—E. M. Bero
*Attorney, Agent, or Firm*—Cushman, Darby & Cushman

[57] ABSTRACT

To carry out the exposure of a photoresist at a pattern scale of 1 : 1, a laser writing-in beam is projected onto the latter. The substrate carrying the photoresist undergoes displacements in at least one of two mutually perpendicular directions. Positioning of the laser beam is obtained through the medium of a deflection system comprising a device for generating pulse trains which control a digital optical deflector. The pulse trains are triggered by electrical pulses supplied from interferometric means monitoring the displacement of the substrate. The whole duration of each one of said pulse trains is smaller than the time interval between the triggering pulses.

6 Claims, 4 Drawing Figures

SYSTEMS FOR WRITING PATTERNS ON PHOTOSENSITIVE SUBSTRATES

Figures 3A, 3B:
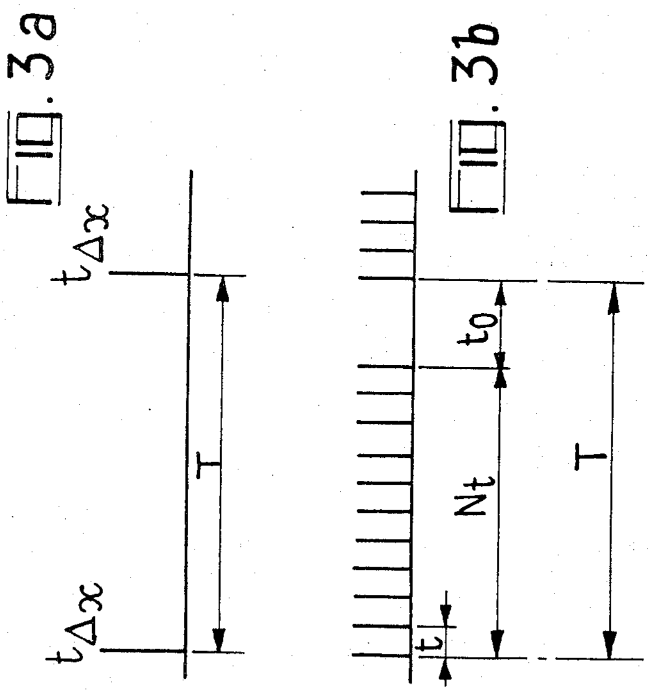

The present invention relates to systems for recording patterns on a photosensitive substrate. It relates more particularly to improvement in the devices which are used to control an electro-optical deflector which displaces a scanning light beam synchronously with the translatory motion of a table on which the photosensitive substrate has previously been mounted.

In recording systems of this kind, a multistage digital deflector is used; each of the stages of the deflector comprises an electrical birefringent cell associated with a deflector element cut from a birefringent body. Positional control is obtained by applying to the stages of the deflector binary signals which are produced for example by a binary counter. Electrical pulses emitted each time the table has displaced a predetermined distance, are applied to the counters so that the deflected beam irradiating the substrate scans a raster made of a succession of contiguous spots arranged in columns. The complete scanning of a photosensitive substrate split up into elementary zones of very small size, requires a digital deflector with a large number of positions and also requires a large number of electrical pulses in order to control said deflector as a function of the displacement of the table. The device which produces the electrical pulses supplies a sufficient number of these if the elementary irradiated zones have a width in the order of some 10 microns. By contrast, if the width of each of the zones irradiated by the light beam is in the order of one micron only, then the electrical pulses can only control a deflector having a small number of positions. Under these circumstances, the area scanned by the beam is quite inadequate and this complicates the operations of recording patterns.

The object of the present invention is to overcome these drawbacks and the invention relates to improvement in systems for recording patterns upon photographic substrates, which improvement makes it possible to reduce the dimensions of the light beam in a substantial proportion whilst retaining the number of positions which the deflector can produce and which the necessary for the proper operation of the system.

According to the present invention, there is provided a system controlling the displacement of a luminous spot having a predetermined width 1, for inscribing a predetermined pattern onto a photosensitive substrate carried by a table undergoing of a translatory motion along a first translation axis, said system comprising: a source of radiant energy supplying said beam, deflector means positioned between said source and said table for deflecting said beam along a direction at an angle with said first translation axis, interferometric measuring means associated with said table for supplying triggering pulses respectively emitted in accordance with quantized displacements $\Delta X$ of said table along said first translation axis, pulse train genertor means having a control input for receiving said triggering pulses and an output delivering pulse trains including a plurality of successive control pulses and motor means being provided for driving said table along said first translation axis; said deflector means having a control input coupled to the output of said pulse train generator means; the whole duration of each one of said pulse trains being smaller than the time interval between one and the next one of said triggering pulses.

Figure 1:
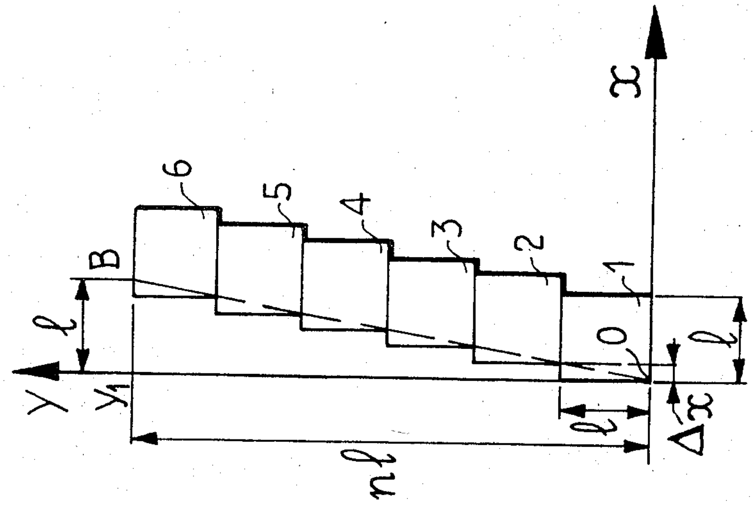

The invention will be better understood from a consideration of the ensuing description and the attached figures in which:

FIG. 1 is an explanatory diagram.

Figure 2:
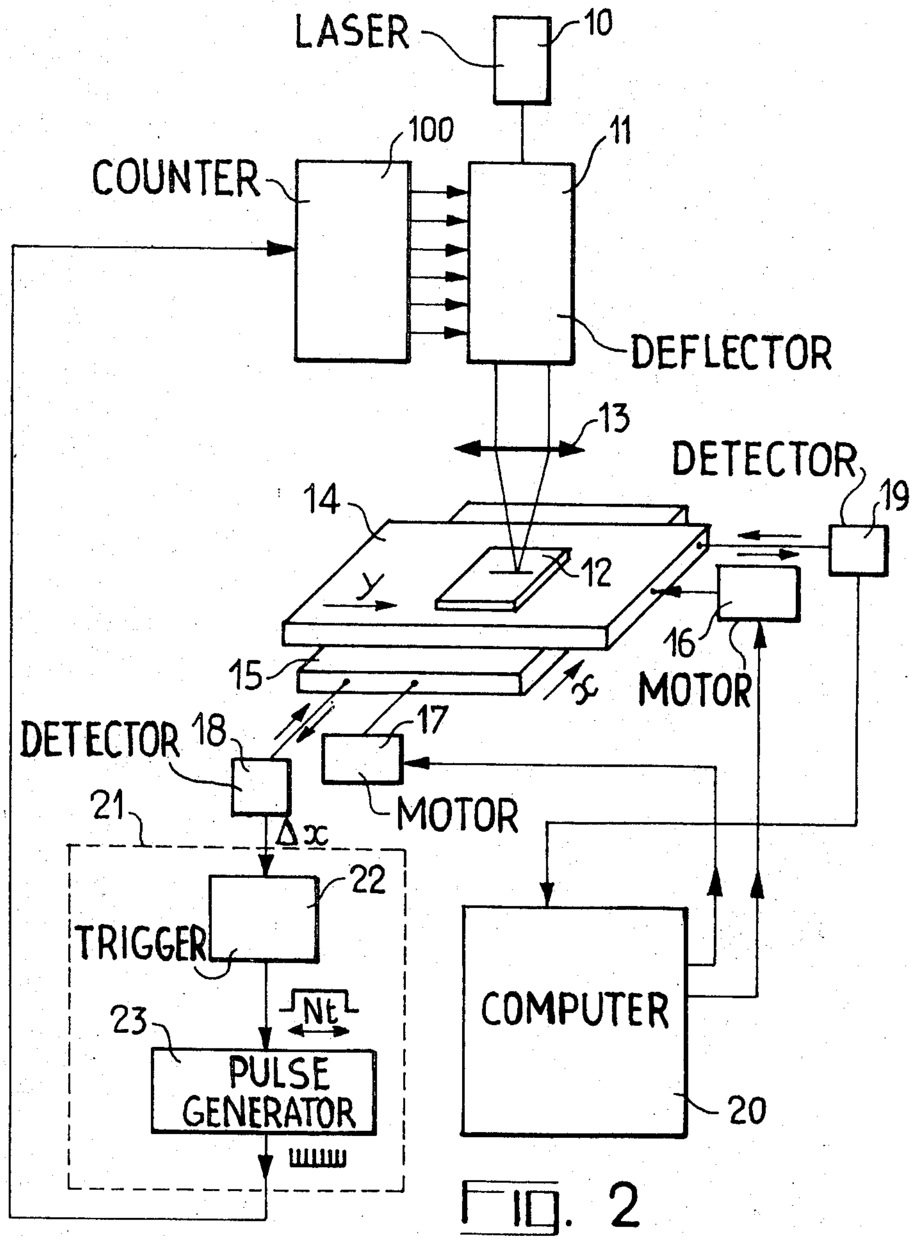

FIG. 2 schematically illustrates a recording system in accordance with the invention.

FIGS. 3*a* and 3*b* schematically illustrates the distribution and length of the pulses produced by the system shown in FIG. 2.

FIG. 1 is an explanatory diagram of a prior art scanning method. The plane of the figure is that of the photosensitive substrate upon which the scanning of a pattern is carried out.

This result is achieved by a translatory movement in the $x$ axis direction, of the photosensitive substrate, and by displacement in a direction substantially perpendicular thereto of the writing light beam.

In FIG. 1, the impact of the writing beam on the photosensitive substrate, is marked by a square spot, having a width equal to 1. Although successive positions of the light spot are represented in FIG. 1 by the squares 1 to 6, it should be understood, of course, that in reality the number of positions that the deflector can produce is a matter of arbitrary choice and may in particular be very much greater than 6 so that in the remainder of the description, the total number of positions which the light beam can occupy and exit from the deflector, will be marked by the letter $n$. Thus, the light spot of width 1 is deflected $n$ times its own width by a $n$-position digital deflector. The length $y_1$ corresponding to a displacement $\Delta y$ on the part of the light spot along the $y$ axis, is equal to the product $nl$. Transfer from each of the positions to the next, is controlled by an electrical pulse produced each time that the substrate is displaced along the $x$ axis by a predetermined distance $\Delta x$. This pulse operates a binary counter whose output signals control the successive deflection stages of the deflector.

In order for the system to operate satisfactorily, it is necessary for the $(n+1)$ tieth spot produced by the recording beam to be formed exactly by the side of the first spot; the result is that the offset $\Delta x$ between two successive spots in a deflection cycle, must satisfy the condition:

$$n + 1/\Delta x \qquad (1)$$

This condition makes it possible to determine the number n of positions of a digit deflector, when the displacement $\Delta x$ producing the emission of a control pulse and the width 1 of the spot produced by the recording beam, are known.

By way of example:
quantum of displacement — $\Delta x = 0.04\ \mu$
number of deflector positions — $n = 256$
size of light spot — $1 = 10\ \mu$ These figures correspond to a known design but it is technically possible to obtain at the output of a deflector a light spot the dimension 1 of which is in the order of 1 micron. This possibility means that it is possible to envisage the exposition of a photoresist in accordance with a pattern such as provided in the masks employed for the manufacture of integrated circuits; since this is an extremely fine design, a mask pattern can be produced on the scale 1:1.

However, the application of the relationship (1) hereinbefore referred to means that in this latter case, a value of $n$ which is much too small is obtained, since the interval $\Delta x$ has not changed. If the number $n$ of positions of the deflector is reduced in this way, the scanning amplitude $y = nl$, is still more reduced.

The object of the present invention is to overcome this drawback and the invention relates to novel means of controlling the digital deflector as a function of displacement of the translatory table carrying the photosensitive substrate. These means are illustrated schematically in FIG. 2. A light beam produced by a laser source 10 is deflected by a digital deflector 11 in accordance with one of the two coordinates, in the plane of the photosensitive substrate 12. This substrate is arranged in the image plane of a projection lens 13 and is for example attached to the top of the translatory plates 14 and 15 which constitute the table. Positional detectors 19 and 18 which operate by laser interferometry techniques, enable the displacements of the two plates to be evaluated. The data produced by the positional detector 19 are picked up directly by the computer 20 which controls the movement of the plate 14 along the $y$ axis, by means of the motor 16. This aspect of the operation does not affect the understanding of the present invention and will therefore be neglected in the ensuing description.

When the plate 15 is displaced by means of the motor 17, the detector 18 produces electrical pulses, and in fact a pulse is emitted when the plate has travelled the distance $\Delta x$. Whereas in the known systems, these pulses are directly applied to the counting input of a binary counter 100 associated with the deflector 11, in the case shown in FIG. 2 the pulses are applied to the input of a pulse train generator 21.

By way of example, the generator 21 can be constituted by a monostable trigger stage 22 triggered by pulses coming from the detector 18; this trigger stage controls a pulse generator 23 whose operation corresponds with that of a clock supplying a predetermined number $N$ of pulses. The trains of pulses produced by the generator 23 are counted by the counter 100 which controls the deflector 11.

With each pulse $t_{\Delta x}$ supplied by the detector 18, there corresponds a train of $N$ isochronous pulses emitted within the time interval $Nt$ which is slightly less than the shortest recurrence period of the pulses produced by the detector 18. In FIG. 3, the pulses $t_{\Delta x}$ are represented by the diagram (*a*) whilst the trains of pulses produced by the device 21 are represented by (*b*).

The maximum value of the speed of translation of the plate 15 being known it is arranged that the period $T$ elapsing between the pulses $t_{\Delta x}$ supplied by the detector 18 exceeds tha of the train of pulses by a quantity $t_o$ which is equal to the period $t$ of the pulses which make up the pulse train; to this end, the trigger stage 22 is set so that its relaxation time is equal to $Nt$. It will be seen that the trigger stage 22 remains in its stable state for a time $t_o$ before being triggered again for a time $Nt$. It should be pointed out that if the speed of translation exceeds a maximum value, the duration $t_o$ is no longer equal to $t$ but exceeds it.

The number $N$ of pulses which go to make up the pulse train, is calculated from the following formula:

$$N = n\,\Delta\, x/l$$

$n$ is the number of positions of the digital deflector, $l$ the width of the light spot, $\Delta x$ the displacement along the $x$ axis.

For example, it is possible to utilise a digital deflector with 512 positions, that is to say with nine stages. If the dimension of the light spot is $l = 1\ \mu$ and the displacement $\Delta\, x = 0.08\ \mu$, then $N = 41$.

Under these conditions, it is thus possible to produce upon a photosensitive substrate, a pattern having lines of extremely small width, in the order of one micron. Such a pattern reduced overall size, can be obtained using a deflector having a great number of elementary positions. Consequently, the reduced pattern is capable of representing a very complex structure covering a very small area.

The source utilised can, for example, be an argon laser operating at a wavelength of $\gamma = 0.458\ \mu$. With a source of this kind, it is currently possible to obtain a power of 0.4 watts so that it is possible to directly expose on a scale of 1:1, a photosensitive resin used in the manufacture of integrated circuits.

Under these conditions, it can be shown that for an exposure time of 5 microseconds with a light spot measuring 1 micron, an energy density of as much as 200 joules/sec is achieved. Even taking into account difference in energy losses and taking an efficiency of only 10 percent, the energy which can be used to expose the photosensitive substrate is still equal to 20 joules per $cm^2$. This is widely sufficient to expose a photoresist layer under normal circumstances.

What I claim is:

1. A system controlling the displacement of a luminous spot having a predetermined width 1, for inscribing a predetermined pattern onto a photosensitive substrate carried by a table undergoing a translatory motion along a first translation axis, said system comprising: a source of radiant energy emitting a beam for projection of said spot onto said substrate, n positions deflector means located between said source and said table for deflecting said beam along a direction at an angle with said first translation axis, interferometric measuring means associated with said table for supplying triggering pulses respectively emitted in accordance with quantized displacement $\Delta X$ of said table along said first translation axis, pulse train generator means having a control input for receiving said triggering pulses and an output delivering pulse trains including a plurality of successive control pulses; motor means being provided for driving said table along said first translation axis: said deflector means having a control input coupled to the output of said pulse train generator means; the whole duration of each one of said pulse trains being smaller than the time interval between one and the next one of said triggering pulses.

2. A system as claimed in claim 1, wherein said pulse train generator means provide trains of N pulses, N being substantially equal to $n\,\Delta\, x/1$; the whole duration of each one of said pulse trains being smaller than the time interval between one and the next one of said triggering pulses.

3. A system as claimed in claim 1, wherein said pulse train generator means comprise: a monostable trigger stage triggered by said triggering pulses, and a clock generator delivering said pulse trains under the control of said monostable trigger stage.

4. A system as claimed in claim 1, wherein said $n$ positions deflector means comprise: a binary counter having an input for receiving successive control pulses and a plurality of outputs; said n position deflector means further comprising a multistage deflector assembly controlled by said binary counter.

5. A system as claimed in claim 1, further comprising computer means supplying positioning data; said data controlling said motor means.

6. A system as claimed in claim 5, further comprising: means for displacing said table along a second translation axis at an angle with said first translation axis, and further interferometric means supplying to said computer means pulses corresponding to quantized displacements of said table along said second translation axis; the positioning data supplied from said computer means controlling said further displacing means.

* * * * *